(12) United States Patent
Ezell et al.

(10) Patent No.: US 6,955,707 B2
(45) Date of Patent: Oct. 18, 2005

(54) METHOD OF RECYCLING FLUORINE USING AN ADSORPTION PURIFICATION PROCESS

(75) Inventors: Edward Frederick Ezell, Warren, NJ (US); Richard A. Hogle, Oceanside, CA (US); Walter H. Whitlock, Chapel Hill, NC (US); Graham A. McFarlane, Murrieta, CA (US)

(73) Assignee: The BOC Group, Inc., Murray Hill, NJ (US)

( * ) Notice: Subject to any disclaimer, the term of this patent is extended or adjusted under 35 U.S.C. 154(b) by 206 days.

(21) Appl. No.: 10/166,467

(22) Filed: Jun. 10, 2002

(65) Prior Publication Data

US 2003/0228989 A1 Dec. 11, 2003

(51) Int. Cl.[7] .............................................. B01D 53/22
(52) U.S. Cl. ...................... 95/47; 95/45; 95/53; 95/108
(58) Field of Search ................................ 95/47, 45, 53, 95/108, 46, 48, 54, 131, 149; 423/24; 96/4, 108; 510/175; 134/3

(56) References Cited

U.S. PATENT DOCUMENTS

| | | | |
|---|---|---|---|
| 5,417,742 A | * | 5/1995 | Tamhankar et al. ............ 95/96 |
| 5,797,195 A | | 8/1998 | Huling et al. |
| 5,858,065 A | * | 1/1999 | Li et al. ......................... 95/45 |
| 5,976,222 A | * | 11/1999 | Yang et al. ..................... 95/45 |
| 6,224,677 B1 | * | 5/2001 | Nozawa et al. ............. 118/715 |

FOREIGN PATENT DOCUMENTS

| | | |
|---|---|---|
| EP | 0 366 078 A2 | 5/1990 |
| JP | 2002 033315 A | 1/2002 |

OTHER PUBLICATIONS

European Search Report completed Sep. 23, 2003 of Application No. EP 03 25 3591.

* cited by examiner

*Primary Examiner*—Gregory Webb
(74) *Attorney, Agent, or Firm*—David A. Hey; Mary K. Nicholes

(57) ABSTRACT

A method and apparatus is disclosed for producing fluorine by providing a contained fluorine precursor source located proximate to or remotely from an adsorbent bed, optionally in a replaceable unit that may be a replaceable module comprising both the fluorine source and the adsorbent bed. Fluorine derived preferably from a nitrogen trifluoride source and used to remove deposited silicon-containing impurities in reaction chambers is reclaimed from an adsorbent bed, and made available to the reaction chamber as a supplemental fluorine source to reduce the total required amount of nitrogen trifluoride source gas. The separation column adsorbent is regenerated in cyclical intervals using a reverse flow of inert gas.

18 Claims, 5 Drawing Sheets

F₂ Recycle PSA Measurements
Product Pressure and SiF₄ Concentration

METHOD OF RECYCLING FLUORINE USING AN ADSORPTION PURIFICATION PROCESS

FIELD OF THE INVENTION

The present application relates to the field of gas purification and recycling. More specifically, the present invention relates to the use of recycled fluorine to supplement nitrogen trifluoride for cleaning chamber surfaces, and the purification and recycling of fluorine gas.

BACKGROUND OF THE INVENTION

Semiconductor chip manufacturers have long recognized the deleterious effects of deposits, such as, for example, oxide deposits on the reaction chamber walls in which the various chemical reactions and deposition processes take place during chip manufacture. As impurities build up on reaction chamber surfaces, such as interior chamber walls, the risk increases that such impurities may be co-deposited on target work piece surfaces, such as computer chips. Therefore, such chambers must be periodically cleaned during down cycles in the chip manufacturing process.

One known way to clean the unwanted deposits from interior reaction chamber walls is to produce a fluorine plasma in the reaction chamber, under sub-atmospheric pressure, to remove unwanted silicon-containing oxide deposits from the interior chamber walls. While diatomic fluorine ($F_2$) is an excellent candidate as a source for the fluorine plasma, it is highly reactive. Therefore, the fluorine plasma can be more safely obtained by dissociating other fluorine-containing compounds such as, for example, $NF_3$, $CF_4$, $C_2F_6$, $SF_6$, etc. In essence, any fluorine-containing gas that can be decomposed into active fluorine species potentially can be used for chamber cleaning.

Nitrogen trifluoride ($NF_3$) has proven to be an extremely safe, useful and versatile source of elemental fluorine for reactions, and for use in apparatus cleaning protocols. However, the dramatic surge in demand for $NF_3$ has resulted in a virtual global shortage of this relatively expensive material. In addition, most of the cleaning processes using $NF_3$ only consume about 15% of the fluorine contained within the $NF_3$ in the actual cleaning operation, with the remaining fluorine being exhausted, treated, neutralized and eventually discarded.

Cyclical adsorption processes are generally employed for use in fluorine recycling processes. Such preferred processes include pressure swing adsorption (PSA) and temperature swing adsorption (TSA) cycles, or combinations thereof. The adsorption can be carried out in an arrangement of two or more adsorption beds arranged in parallel and operated out of phase, so that at least one bed is undergoing adsorption while another bed is being regenerated. Specific fluorine recycle applications into which the invention can be incorporated include vacuum vapor deposition and etching chamber cleaning processes, etc.

The fluorine-containing source compound, any other reagents, and inert gases used in the chamber cleaning process are typically supplied as compressed gases and are admitted into the chamber using a combination of pressure controllers and mass flow controllers to effect the cleaning process. The cleaning process itself requires that a plasma be maintained upstream of, or in the chamber to break up the fluorine-containing source compound so that active fluorine ions and radicals are present to perform the cleaning chemistry. To maintain the plasma, the chamber is kept at a low pressure, typically between about 1 and 10 Torr absolute, by using a vacuum pump to remove the gaseous waste products and any unreacted feed gases that comprise the exhaust gas. The pressure in the chamber is typically controlled by regulating the flow of exhaust gas from the chamber to the chamber pump using a vacuum throttle valve and feedback controller to maintain the chamber pressure at he desired setpoint. The chamber cleaning operation is performed intermittently between deposition operations. Typically, one to five deposition operations will be performed between every chamber cleaning operation.

In typical reaction chamber cleaning apparatuses the reaction gases are $NF_3$ and argon. Typically the $NF_3$ is dissociated into nitrogen and energetic fluorine radicals. However, the unused radicals recombine to form fluorine, which is directed from the system as waste and exhausted, such as to a facility abatement device.

It would be advantageous to reclaim a portion of the fluorine waste by purifying the fluorine, discarding the impurities in the waste stream and then return the fluorine for use in the cycle. However, traditional packed column separation techniques have proven unsuitable or unreliable for use with fluorine. Fluorine's high degree of reactivity and instability makes a successful adsorbent selection (for use as adsorbent packing within a separation column) extremely difficult. The adsorbent will combust, or otherwise adversely react prematurely and unpredictably unless the materials used to make the column and the adsorbent bed are made to be non-reactive with fluorine, or are protected by a stable fluoride layer. Traditional steel columns are often too reactive, and plastic vessels and beds combust easily. Silica gels and molecular sieves are also unsuitable for fluorine separation due to their lack of stability when exposed to fluorine.

SUMMARY OF THE INVENTION

In one embodiment, the present invention relates to a method for recycling fluorine from a waste stream by providing a process chamber having an inner surface, said surface having contaminants and providing a stream of fluorine-containing gas from a flowing gas source into the process chamber. The contaminants are contacted with the fluorine-containing gas and removed from the process chamber inner surface to create a waste stream. The waste stream is directed from the process chamber to a purification chamber comprising an adsorption bed containing an adsorbent that adsorbs contaminants in the waste stream in the purification chamber. The waste stream is converted into a recycled fluorine source stream and directed from the purification chamber to the process chamber as a supplemental fluorine source stream.

In another embodiment, the present invention is directed to a method for cleaning impurities from an inner surface of a reaction chamber by providing a process chamber having impurities on an interior surface and directing a flow of a fluorine-containing compound to the process chamber from a fluorine-containing source. The fluorine from the fluorine-containing compound is dissociated with the fluorine associating with the impurities on the interior surface of the process chamber. The fluorine is directed along with the associated impurities from the process chamber to a purification chamber, said cleaning chamber containing an amount of adsorbent onto which the impurities are adsorbed. The purified fluorine is directed from the purification chamber to the process chamber to supplement the fluorine-containing source.

In yet another embodiment, the present invention relates to a method for adsorbing impurities from a fluorine-containing stream in an adsorbent bed by directing a flow of a fluorine-containing compound to a process chamber having an inner surface with impurities deposited on the inner surface and dissociating the fluorine from the fluorine-containing compound, to associate with the impurities in the process chamber. The fluorine with impurities is directed from the process chamber to a purification chamber that contains an amount of adsorbent for adsorbing the impurities onto the adsorbent. The purified fluorine is directed from the purification chamber to a fluorine storage tank.

In addition, the present invention is directed to an apparatus for cleaning impurities from a reaction chamber having a process chamber having at least one inlet and one waste stream outlet, the inlet in fluid communication with a source of fluorine; a waste stream for directing a fluorine-containing compound and impurities from the process chamber in fluid communication with the process chamber; and a purification chamber having an inlet and an outlet, the purification chamber inlet in fluid communication with the waste stream outlet and preferably located downstream from the process chamber, the purification chamber comprising an amount of adsorbent, with the purification chamber outlet in fluid communication with a pathway for directing purified fluorine from the purification chamber to the process chamber.

In a still further embodiment, the present invention is directed to a method for producing fluorine by providing a contained fluorine precursor source located proximate to an adsorbent bed in a replaceable unit, an electrolytic cell comprising an electrode, said cell charged with an amount of electrolyte and a power supply. Current is directed from the power supply to the electrolytic cell and then the fluorine precursor is directed to the electrolytic cell. An amount of impure fluorine is collected from the electrolyte of the electrolytic cell and directed to the adsorbent bed where impurities are absorbed from the impure fluorine on the adsorbent in the adsorbent bed while directing newly produced, purified fluorine from the adsorbent bed.

In yet another embodiment, the present invention is directed to an apparatus for producing purified fluorine comprising a replaceable module, said module comprising a fluorine precursor source and an adsorbent bed chamber having an adsorbent bed. The chamber is located proximately to the fluorine precursor source. The chamber and the fluorine precursor source are in communication with an electrolytic cell for producing fluorine gas.

In still further embodiments, the present invention is directed to incorporating a replaceable module comprising a fluorine precursor source and an adsorbent chamber for the production of fluorine to be directed to the aforementioned processing chamber having at least one inlet and one waste stream.

In one embodiment, the present invention is directed to a chamber cleaning process that incorporates in situ, real-time purification and recycling of fluorine-containing gases, and that results in a diminished use of $NF_3$. The present methods and apparatuses can be used to recycle the unused active fluorine species regardless of the original reagent chemical used.

In a further embodiment, the present invention is directed to an adsorbent material comprising $CF_x$ (wherein x is from about 0.9 to about 1.2), and polytetrafluoroethylene (PTFE) in a ratio of about 9:1 ($CF_x$:PTFE). In a further embodiment, an amount of pore-forming material is added to the composition.

In another embodiment, the present invention is directed to a method for recycling fluorine from a waste stream. A process chamber is provided with a waste stream in fluid communication with a purification chamber, said waste stream comprising a fluorine-containing mixture containing impurities. A purification chamber is provided in fluid communication with the waste stream. The purification chamber is packed with an amount of $CF_x$ adsorbent in a separation zone, wherein x is from about 0.9 to about 1.2. The waste stream is directed from the process chamber to the purification chamber, and an amount of fluorine is separated from the fluorine-containing mixture in the purification chamber. The impurities in the waste stream are adsorbed on the $CF_x$ adsorbent in the purification chamber, and the purified fluorine is directed from the purification chamber to a storage tank, or sent directly into the process chamber. Efficient adsorption of the impurities to be captured on the $CF_x$ preferably occurs in the temperature range of from about −150° C. to about 20° C., more preferably from about −80° C. to about 10° C., and most preferably from about 40° C. to about −10° C. Further, the desired efficient adsorption of the impurities on the $CF_x$ preferably occurs in the pressure range of from about 300 torr to about 2000 torr, and more preferably from about 500 torr to about 1200 torr.

In still another embodiment, the present invention is directed to a method for cleaning impurities from an inner surface of a reaction chamber. A reaction chamber, or process chamber is provided having impurities on an interior surface, and a flow of a fluorine-containing compound is directed to the process chamber from a fluorine-containing source. The fluorine is dissociated from the fluorine-containing compound, said fluorine associating and reacting with the impurities on the interior surface of the reaction chamber. The fluorine and impurities are directed out of the reaction chamber, preferably under vacuum, to a cleaning chamber, said cleaning chamber packed with an amount of $CF_x$ adsorbent, wherein x is from about 0.9 to about 1.2, and the $CF_x$ comprises an amount of PTFE. The impurities are adsorbed onto the $CF_x$ thereby releasing, purified fluorine from the adsorbent bed. The purified fluorine is eventually directed from the purification chamber to the process chamber to supplement the fluorine-containing source in the process chamber. Efficient adsorption of the impurities to be captured on the $CF_x$ adsorbent preferably occurs in the temperature range of from about −150° C. to about 20° C., more preferably from about −80° C. to about 10° C., and most preferably from about −40° C. to about −10° C. Further, the desired efficient adsorption of the impurities on the $CF_x$ preferably occurs in the pressure range of from about 300 torr to about 2000 torr, and more preferably from about 500 torr to about 1200 torr.

Further, the present invention is directed to a method for adsorbing impurities from a fluorine-containing stream in a regenerated adsorbent bed. A flow of fluorine-containing compounds from a fluorine-containing source is directed to a process or reaction chamber. The fluorine is dissociated from the fluorine-containing compound. The fluorine associates and reacts with the impurities in the processing chamber, for example, on the interior surface of the processing chamber. The fluorine, commingled with impurities, is directed to a purification chamber containing an amount of $CF_x$ adsorbent, wherein x is from about 0.9 to about 1.2 and the $CF_x$ comprises an amount of PTFE. The impurities are adsorbed onto the $CF_x$ and the liberated, purified fluorine is directed from the purification chamber to a fluorine storage tank. To accelerate regeneration of the $CF_x$ adsorbent bed in the purification chamber during off-cycle (when the process chamber is not being cleaned), a flow of inert gas is preferably directed through an inlet into the cleaning chamber, and the adsorbed impurities and inert compounds are removed from the $CF_x$ and exhausted from the purification chamber.

Still further, the present invention is directed to an apparatus for cleaning impurities from a process chamber having at least one inlet and one waste stream. The process chamber inlet is in fluid communication with a source of fluorine. A waste stream for directing a fluorine-containing compound and impurities from the process chamber are both in fluid communication with the process chamber and a purification chamber. The purification chamber has an inlet and an outlet, the inlet being in fluid communication with the waste stream, and located downstream from the process chamber. The purification chamber comprises an amount of $CF_x$ combined with an amount of PTFE, preferably in a wt % ratio of about 9:1 ($CF_x$:PTFE) as an adsorbent for the impurities, wherein x is from about 0.9 to about 1.2, with the purification chamber column outlet in fluid communication with a pathway for directing purified fluorine from the purification chamber to the process chamber.

BRIEF DESCRIPTION OF THE DRAWINGS

Figure 1:
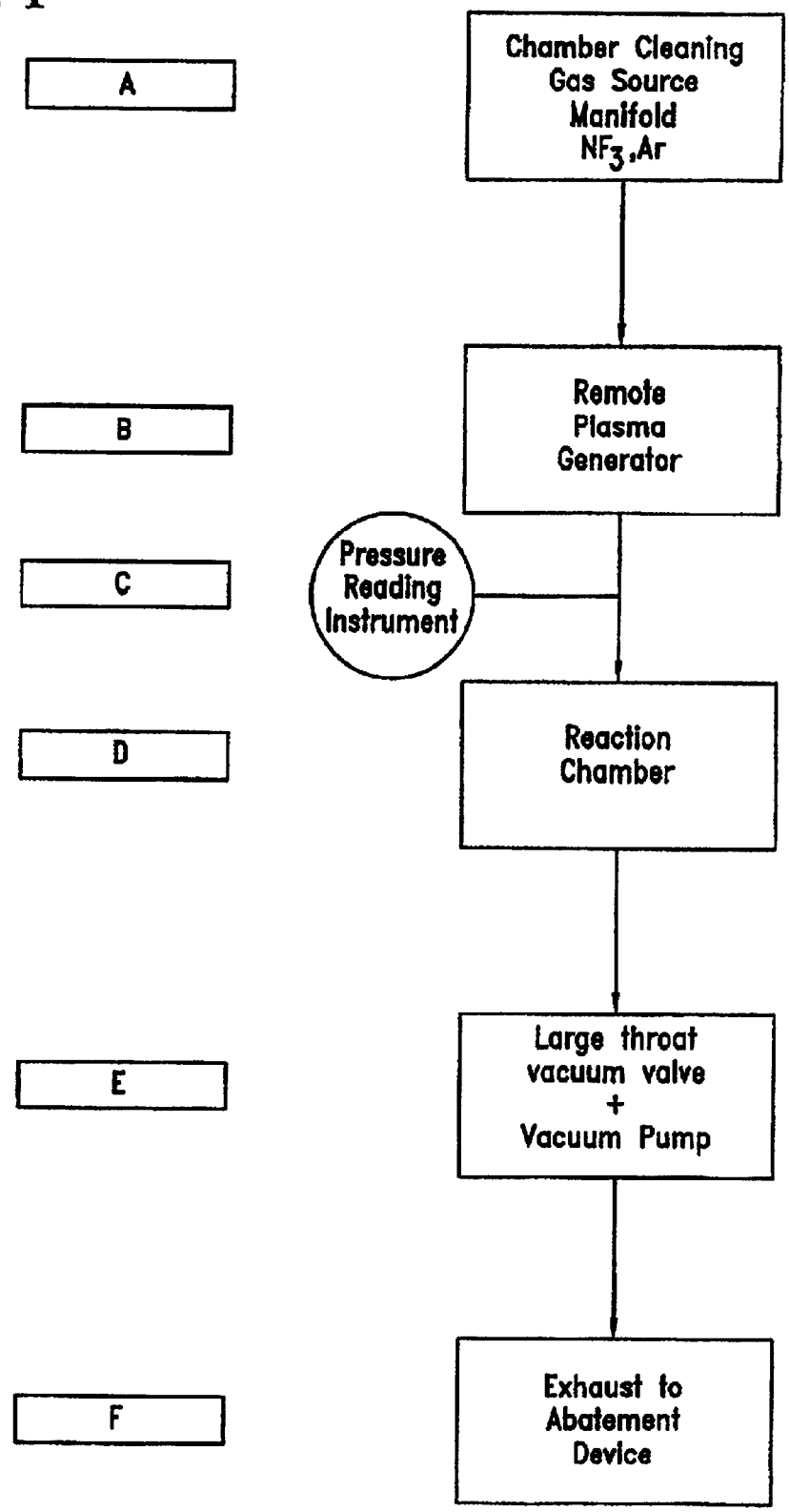

Having thus described the invention in general terms, reference will now be made to the accompanying drawings, which are not necessarily drawn to scale, and wherein:

FIG. 1 is a block diagram describing a typical reaction chamber cleaning process.

Figure 2:
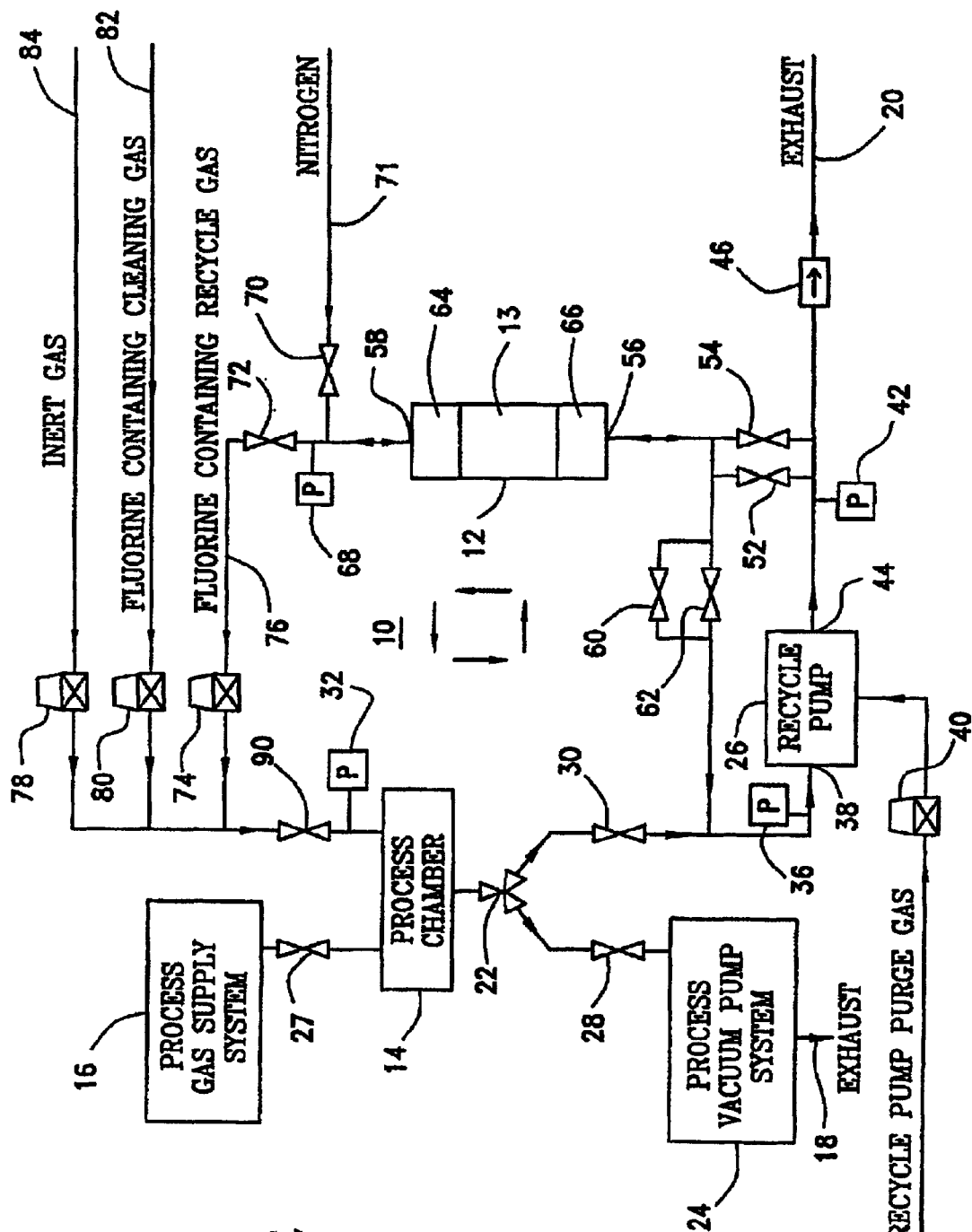
Figure 3:
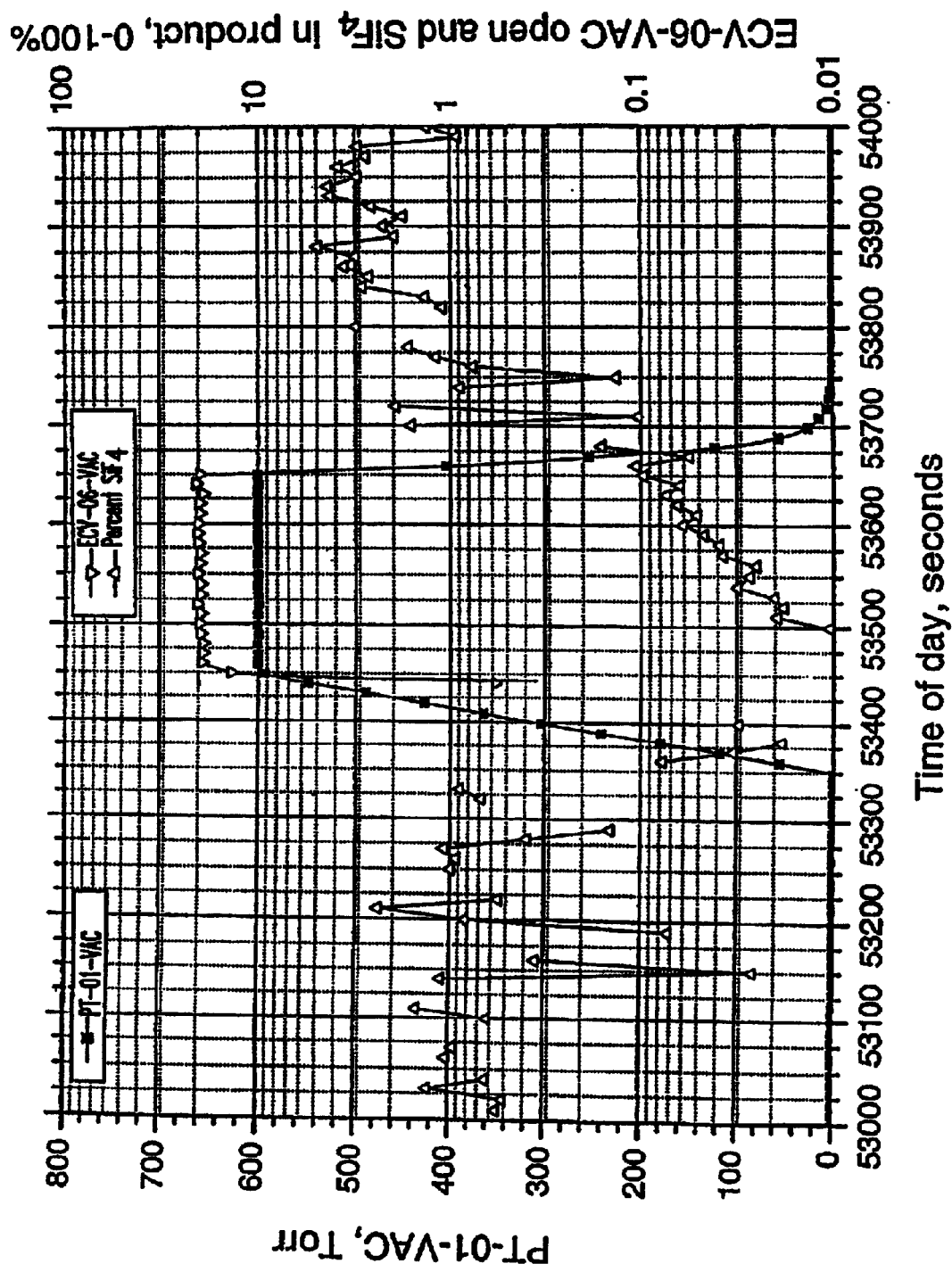

FIG. 2 is a schematic representation of a preferred process of the present invention; and FIG. 3 is a graph showing the reaction cycle of a representative process of the present invention.

Figure 4:
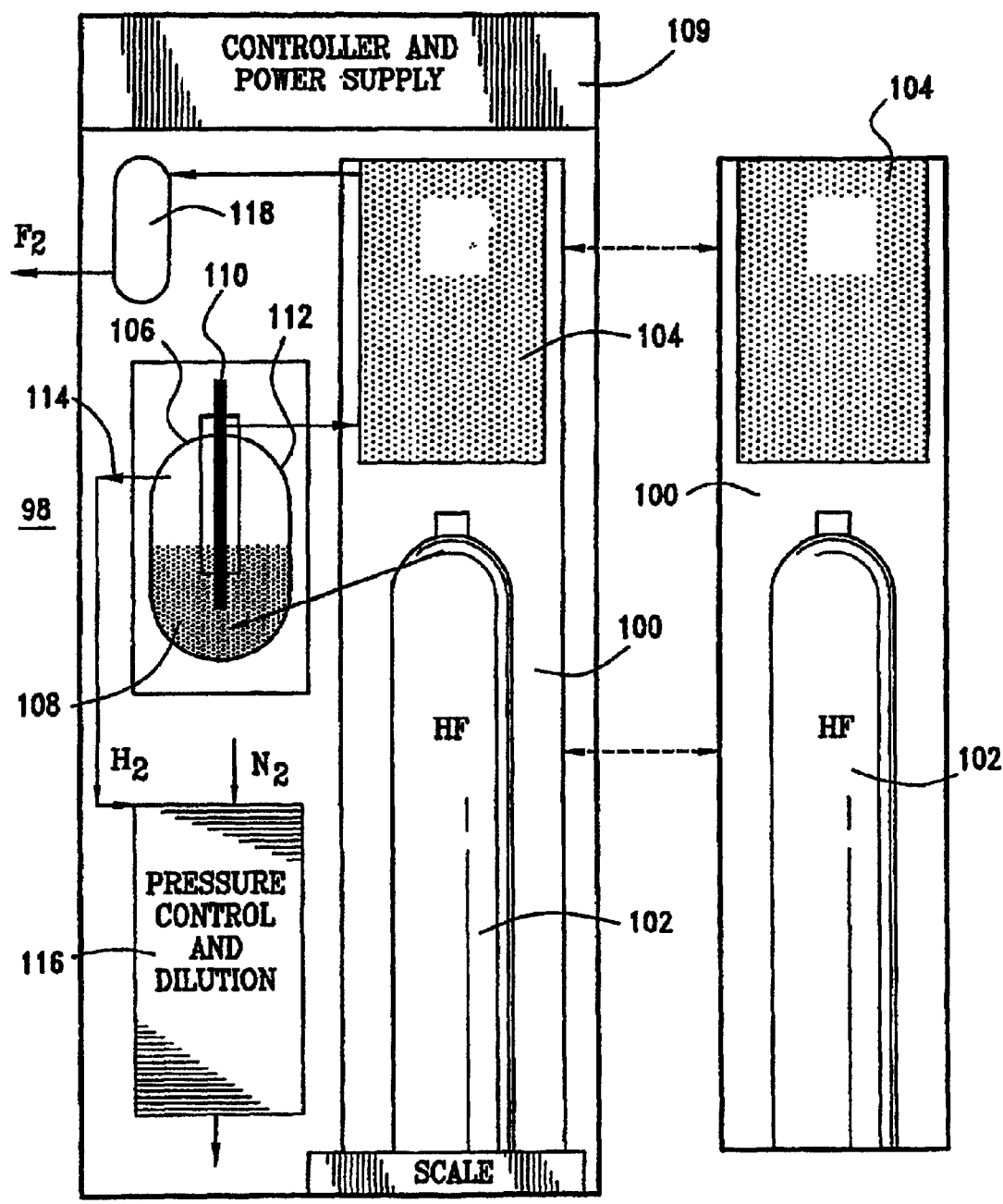
Figure 5:
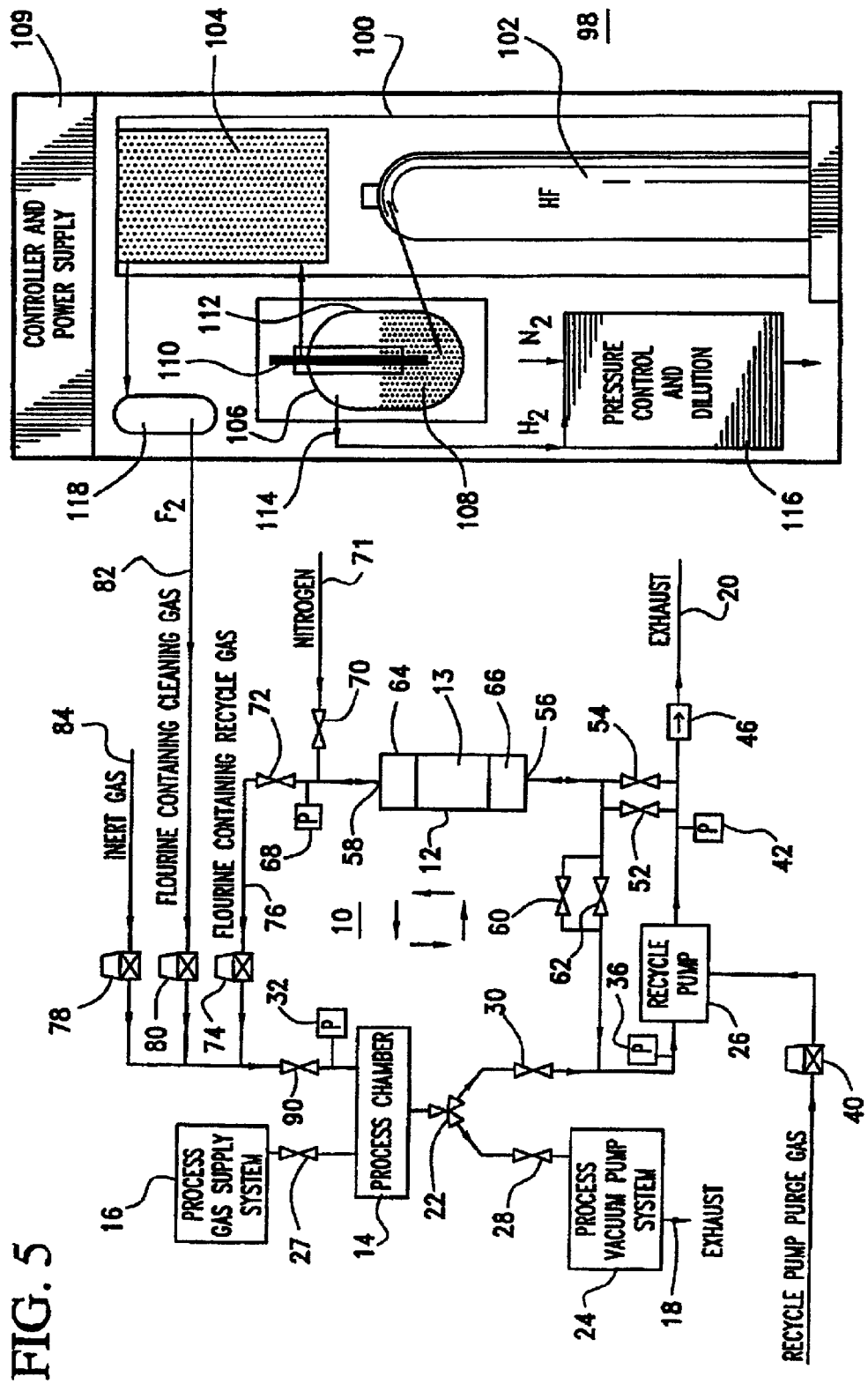

FIGS. 4 and 5 are schematic representations of a preferred embodiment of the present invention showing a modular HF source and adsorbent bed.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

FIG. 1. is a simple drawing showing a typical reaction chamber cleaning apparatus. Block A represents a source manifold for the chamber cleaning gases. In a typical configuration the gases used are $NF_3$ and argon. Block B represents a remote plasma generator. Block C is a pressure reading instrument. Block D represents the reaction chamber from which unwanted deposition products are to be cleaned. Block E is a large throat vacuum valve and vacuum pump, which together with Block C provides pressure control during the reaction clamber clean cycle. Block F is an exhaust port leading to an abatement device.

During a typical chamber cleaning process, a flow of argon in the range of from about 1 to about 6 slm from the source manifold (A) is established and allowed to flow into the remote plasma generator (B). Pressure in the generator is kept between from about 1 to 4 Torr by a feedback loop established between the pressure reading instrument (C) and the large throat vacuum valve and vacuum pump (E). A plasma is ignited and allowed to stabilize. A flow of $NF_3$ from (A) is then established usually in the range of from about 1 to about 6 slm. The argon flow is adjusted to meet process requirements usually in the range zero to two times the $NF_3$ flow rate. Once the flow rates have stabilized, pressure in the generator is maintained in the range of from about 1 to about 10 Torr.

In the remote plasma generator (B), the $NF_3$ is dissociated into nitrogen and energetic fluorine radicals. The outlet flow from the remote plasma generator then comprises a gas mixture containing amounts of fluorine radicals, nitrogen, argon and undissociated $NF_3$. This gas mixture enters the reaction chamber (D). In the reaction chamber (D) the energetic fluorine radicals react with unwanted deposition products, such as silicon-containing oxides, etc. thereby cleaning the chamber of unwanted deposits. This reaction proceeds typically for a period of from about one to several minutes until the unwanted deposition products are removed from the chamber. In some cases, the reaction endpoint is monitored with an optical endpoint indicator.

During chamber cleaning only a small fraction of the available fluorine radicals react to remove the unwanted deposition products from the reaction chamber. Indeed, the majority of the fluorine radicals recombine to create elemental fluorine. This fluorine is not available to participate in further cleaning reactions. Instead, this fluorine along with nitrogen, argon, undissociated $NF_3$, $SiF_4$, oxygen and other reaction products is exhausted to a facility abatement device (F) through the large throat vacuum valve and vacuum pump (E).

FIG. 2 shows one preferred embodiment of the present invention. As shown in FIG. 2, in one embodiment, the present invention is directed to a stand-alone recycle-based cleaning support system 10 comprising cleaning chamber 12 in fluid communication with a generic process chamber 14. This recycling system delivers recycled fluorine gas from the cleaning chamber to the process chamber. The cleaning gas comprises variable amounts of $NF_3$, $CF_4$, recycled $F_2$, $F_2$ from other sources, other fluorine containing gases, such as $SF_6$, and variable amounts of inert gas such as helium or argon. The recycle system removes exhaust gas from the process chamber 14 which is typically under vacuum during cleaning, while managing the abatement and/or recovery, purification, blending, and re-introduction of the cleaning gas into the process chamber 14 to achieve some composition and pressure setpoint in the chamber 14. Ultimately, the recycle system of the present invention manages the available resources (tool exhaust waste, supply gases, power) to lower the total cost of operating the tool cleaning process.

The process chamber 14 includes the remote plasma generator (not shown). The gas supply 16 and exhaust system 18 used for oxide deposition are shown separate from the cleaning process. Three port switching valve 22 selects between the process gas vacuum pump 24 or the recycle pump 26 for process chamber exhaust management. Valves 27 and 28 are used to isolate the process gas supply system 16 and process gas vacuum pump 24. Note that valve 27 may actually represent more than one valve.

Valve 30 preferably is a large throat vacuum valve. In some control cases it can be operated as a throttle valve, in which case a pressure signal is taken from pressure transducer (not shown) and used to adjust the opening of valve 30 in a feedback loop to control the total pressure in the process chamber 14. In other control cases, valve 30 is set to a partially open throttling position or simply set to the full open or full closed position.

Recycle pump 26 preferably is a large displacement vacuum pump that is compatible with the use of a purified (nearly 100%) fluorine gas stream. The available displacement is designed to deliver the required vacuum levels in the process chamber 14 during cleaning. In general, the pump 26 will require purging with a dry inert gas such as argon, nitrogen and helium.

Pressure transducer 36 senses pressure (vacuum) on the inlet side 38 of the recycle pump 26. Mass flow controller 40 supplies an inert gas used to purge portions of the recycle pump 26. Pressure transducer 42 senses pressure (vacuum) on the outlet side 44 of the recycle pump 26. Check valve 46 controls venting of the recycle pump exhaust 20 to the abatement system (not shown), which is assumed to run at about 1 atmosphere absolute. Valve 46 is shown as a check valve allowing flow to the abatement system whenever the pressure of the recycle pump exhaust 20 is above the abatement system pressure, but also preventing backflow from the abatement system when the pressure at pressure transducer 42 is less than the abatement system pressure. Valve 46 could also be a mechanical backpressure regulator or a throttle valve together with a feedback controller operating with pressure transducer 42 to maintain a pressure setpoint.

Valves 52 and 54 control flow of gas from the outlet 44 of the recycle pump 26 to the inlet 56 of the cleaning chamber 12. Preferably, valve 54 is a full flow open/close valve and valve 52 is a restricted flow open/close valve. It is understood that a single throttle valve (not shown) could replace this valve combination. The use of two valves restricts the flow of gas into an adsorbent bed 13 in cleaning chamber 12 when there is a large pressure difference and provide a "soft start". The use of the two valves is also wasteful when the outlet 44 of the recycle pump 26 is at atmospheric pressure and the adsorbent bed 13 is under vacuum at the start of the adsorption cycle. The adsorbent bed comprises $CF_x$ wherein x is from about 0.9 to about 1.2, and is pelletized according to the methods described herein, said $CF_x$ further comprising an amount of PTFE and optionally a pore-forming agent.

According to the present invention, valves 60, 62 would be used when the inlet 38 of the recycle pump 26 is at vacuum and the adsorbent bed 13 is under pressure at the start of the bed regeneration cycle. Valves 60 and 62 control the flow of gas from the inlet 56 of the adsorbent bed 12 to the inlet 38 of the recycle pump 26. Preferably, valve 62 is a full flow open/close valve and valve 60 is a restricted flow open/close valve. It is understood that a single throttle valve could replace this valve combination. The two valves 60, 62 work to restrict the flow of gas into the recycle pump 26 when there is a large pressure difference and provide a "soft start".

Heat exchangers 64, 66 ensure the gas entering the cleaning chamber 12 is at the desired adsorbent bed target temperature, preferably about −30° C. Heat exchanger 64 is optional. Pressure transducer 68 senses pressure (vacuum) in the adsorbent bed 13. Since there is no significant pressure drop through the adsorbent bed 13 pressure transducer 68 could also be placed elsewhere, such as at the bed inlet 56.

Valve 70 admits nitrogen (or other inert purge gas such as argon or helium) from a nitrogen source (not shown) during the bed regeneration cycle to provide a reverse "flush". It is understood that valve 70 could be any useful valve such as, for example, a throttle valve, an open/closed valve in series with a fixed orifice, an adjustable needle valve, or a small mass flow controller. Valve 72 and mass flow controller 74 control return of purified fluorine-containing recycle gas 76 to the process chamber 14. In some control approaches, valve 72 is an open/closed valve and controller 74 both measures and controls flow rate. Under other control approaches, controller 74 provides only flow rate control (no mass flow measurement) and valve 72 is absent. Under still other control approaches, both controller 74 and valve 72 are present, but controller 74 only provides flow rate control.

Mass flow controllers 78 and 80 control the feed of source gases 84, 82 respectively, from sources that are not shown (exclusive of recycle gases) to the process chamber 14 during the cleaning process cycle. Depending on the detailed process start up requirements, inert gas 84 may or may not be required. Generally, the flow rate of one or more source gases 82, 84 will be reduced as recycle gas 76 is returned to the process chamber. Valve 90 isolates the process chamber 14 from the cleaning gas input streams 82, 84 and 76, such as during deposition. Pressure transducer 32 senses pressure (vacuum) inside the process chamber 14, and is used as an input signal for controlling process chamber pressure during the cleaning process cycle. Control is achieved using a feedback controller to adjust either the vacuum pumping speed (by controlling valve 30 or the recycle pump 26) or the cleaning gas mixture feed rate (by controlling controllers 74, 78, 80) or by controlling both the pump 26 and controllers 74, 78, 80.

In the following mode of operation, the present invention makes control of the feed gas composition and flow rate the primary control objective, and accepting 100% of the available recycled gas 76 as a secondary objective. In this mode of operation, pressure in the process chamber is controlled by measuring with pressure transducer 32 and using a feedback loop to control the position of vacuum throttle valve 30. Pressure in the adsorbent bed 13 initially starts at zero (end of regeneration conditions). At the appropriate time, valve 52 opens to begin pressurizing the bed 13, in the cleaning chamber 12 at a controlled rate. When the pressure measured by pressure transducer 68 is equal to transducer 42, valve 54 is opened. Pressure in the adsorbent bed 13 is then determined by pressure drop through valve 46. The feed gas composition and flow rate to the process chamber 14 are controlled by setting the flow rate on the individual mass flow controllers. These mass flow controller setpoints will vary with time. For example, controller 74 starts out at zero and increases as recycle gas 76 becomes available. The setpoints for the other mass flow controllers are decreased based on the flow of recycle gas 76 and based on keeping vacuum throttle valve 30 from opening too far. When the transducer 68 has increased above the target adsorption pressure, the recycle gas is available. Recycle gas 76 can be withdrawn from the adsorbent bed 13 up to flow rates where transducer 68 drops below some minimum. Excess exhaust gas 20 from the recycle pump 26 that is not purified for recycle is vented to abatement through valve 46. Assuming that the cycle starts from a fully regenerated, evacuated, and isolated adsorbent bed condition, the following steps occur. Preferably, the process chamber pressure control is enabled using transducer 32, feedback loop, and valve 30. A flow of plasma ignition gas from feed gas 84 is established with argon in the range of from about 1 to 6 slm and the plasma is ignited. A flow of $NF_3$ is established from feed gas 82 in the range of from about 1 to 6 slm. The flows are allowed to stabilize, then feed gases 82, 84 are adjusted for cleaning conditions in process chamber 14. The appropriate gas composition and pressure is then achieved at outlet 44 of recycle pump 26. Valve 52 is opened, followed by opening valve 54. After the appropriate pressure is obtained in the cleaning chamber 12, the pressure transducer 68 is monitored. A controlled flow of recycle gas 76 is sent through controller 74 into process chamber 14 followed by reducing the flow of new fluorine containing cleaning gas 82. Transducer 68 is monitored to be certain that controller 74 is not over-drawing the PSA bed production rate. Controllers 78, 80, and 74 are adjusted to control feed gases 84, 82 and 76 respectively until end of the process chamber cleaning cycle. The plasma source is then shut off, as is the feed gas flow (close valve 90, controllers 74, 78, 80, valve 72), followed by closing close valves 52 and 54. Valve 30 is then closed to isolate the process chamber 14 from the cleaning gas recycle system. The three port switching valve 22 is set to select the process vacuum pump 24. Valve 28 is then opened to evacuate process chamber 14. Since the process chamber cleaning cycle is now complete, the process chamber 14 can now be used for deposition, and the adsorbent bed 13 in the chamber 12 can now be regenerated concurrently, on-line, while deposition takes place in process chamber 14. Valve 60 is opened followed by valve 62 when transducer value 68 is close enough to transducer value 36 for soft start. Valve 70 is then opened to admit a controlled flow rate of flush gas 71 (nitrogen or other inert gas such as argon or helium) to reverse flush the adsorbent bed 13. Valve 70 is closed and the cleaning chamber 12 is evacuated. Valve 60 and 62 are then closed to isolate the adsorbent bed 13 in the cleaning chamber 12.

The following mode of operation makes 100% utilization of the available recycle gas as the primary control objective, while the control of the feed gas composition and flow rate are secondary objectives. In this mode of operation, the process chamber exhaust valve 30 is set to a fixed position. Pressure in the process chamber 14 is controlled by measuring with transducer 32 and using a feedback loop to control the flow 82 of fresh fluorine containing cleaning gas. The feed gas composition is controlled by adjusting controller 78 (inert gas flow) and valve 30 to indirectly increase or decrease the gas flow 82 setpoint. The pressure in the adsorbent bed 13 initially starts at zero (end of bed regeneration conditions). At the appropriate time, valve 52 opens to begin pressurizing the bed 13 at a controlled rate. When the pressure measured by transducer 68 is equal to that shown by transducer 42, valve 54 is opened. The pressure in the adsorbent bed 13 continues to increase. When the pressure setpoint for PSA adsorption is reached as shown at transducer 68, valve 72 is opened and a PID loop is used to control the setpoint on controller 74 (or to control valve position) to maintain the PSA pressure setpoint. In this way, 100% of the available recycle gas is returned as feed to the process chamber 14. The process chamber pressure control loop reduces the flow through controller 80 to compensate and maintain process chamber 14 pressure. Assuming a start from a filly regenerated, evacuated, and isolated adsorbent bed condition, the following steps occur. Valve 30 is opened to the target throttle valve position. A flow of plasma ignition gas is established and the plasma is ignited. The process chamber pressure control is enabled using transducer 32, feedback loop, and flow controller 80. Valve 30 is adjusted along with controller 78 for the cleaning mode. The appropriate gas combination and pressure is achieved at the outlet 44 of recycle pump 26. Valves 52 and 54 are opened sequentially. Valve 72 is then opened and the adsorbent bed pressure control is enabled using pressure transducer 68, PID loop, and controller 74. When the adsorbent bed pressure reaches the target PSA pressure, 100% of the available recycle gas 76 is sent to the process chamber 14. The increased feed gas flow to the process chamber 14 will cause the process chamber pressure to increase, which will reduce the flow rate of new fluorine-containing cleaning gas feed 82 through controller 80. Controller 78 and valve 30 are set to the throttle position, and chamber pressure control setpoint to control feed gas flow until end of the process chamber cleaning cycle. The plasma generator is then shut off as well as the flow of feed gas. This is accomplished by closing valves 90, 72 and controllers 74, 78 and 80. Valves 52 and 54 are then closed. Valve 30 is then closed to isolate the process chamber 14 from the cleaning gas recycle system. The three port switching valve 22 is set to select the process vacuum pump 24. Valve 28 is then opened to evacuate process chamber 14. The process chamber 14 can now be used for any intended operation, such as, for example, deposition. At this time the regeneration of adsorbent bed 13 desirably occurs. Valves 60 and 62 are opened sequentially when the pressure at transducer 68 is close to the pressure at transducer 36. Valve 70 is then opened to admit a controlled flow rate of flush gas (nitrogen or other inert gas such as argon or helium) 71 from a source (not shown) to reverse flush the adsorbent bed 13. Valve 70 is then closed and chamber 12 is evacuated. Valves 60 and 62 are then closed to isolate the adsorbent bed 13.

FIG. 3 is a graph showing the adsorption cycle of the present invention. The symbol ($\Delta$) represents the $SiF_4$ concentration at the outlet 58 of the adsorbent bed chamber 12. At the beginning of the cycle under investigation, the $SiF_4$ concentration at the outlet 58 is at some relatively high level until the operating pressure equal to about 600 Torr at about $-30°$ is achieved in the adsorbent bed 13. Once the operating pressure is reached, the graph shows that, during this phase of the recycling process, the $SiF_4$ concentration at the adsorbent bed outlet 58 drops appreciably as the $SiF_4$ is adsorbed on the $CF_x$ adsorbent in the adsorbent bed 13. As shown in FIG. 3, as the pressure in the adsorbent bed 13 is reduced, the $SiF_4$ concentration at the outlet 58 of the adsorbent bed 13 predictably begins to once again increase to the relatively high level noted earlier in the cycle. Typical reaction chamber cleaning processes flow $NF_3$ in the range of from about 1 to about 2.5 slm and argon in the range of from about 0 to about 5 slm. The duration of $NF_3$ chamber cleaning processes is in the range of from about 50 to about 300 seconds.

According to FIGS. 4 and 5, a preferred purified fluorine system 98 is provided. A novel modular, replaceable unit 100 is contemplated comprising a fluorine precursor source, preferably hydrogen fluoride (HF) cylinder 102 and an adsorbent bed 104. Preferably the bed 104 comprises $CF_x$, NaF or combinations thereof. The bed 104 is preferably chilled to capture low levels of contaminants that may arise from the HF, such as $SiF_4$, $AsF_3$, $AsF_5$, etc. The HF cylinder 102 contains the fluorine source precursor that is required for the purified fluorine gas production. The HF cylinder 102 is connected to an electrolytic cell chamber 106, preferably containing KF.2(HF) electrolyte 108. A carbon electrode 110 is placed into the electrolyte 108, and a current from a power supply 109 is applied across the electrode (anode) 110 and the outside of the cell chamber 106. Fluorine is then generated on the anode surface 110 and hydrogen is generated on the chamber walls 112. The hydrogen leaves the system through pathway 114, and is diluted, preferably with nitrogen in a pressure control and dilution tank 116. The fluorine produced contains HF, KF and other impurities, and is directed to the bed 104 in the replaceable module 100. The HF and other impurities are adsorbed by the adsorbent bed 104. The purified fluorine is then directed from the bed 104 to a fluorine surge tank 118 until the fluorine is ready to be directed to the process of FIG. 2 as the fluorine source 82, as shown in FIG. 5. The term "purified fluorine" is understood by those skilled in the field of gas manufacture and purification as being as impurity-free as exposure to the adsorbent bed will allow, approaching about 100% fluorine. The use of the fluorine production system 98 does not generate $N_2$ and therefore delivers a higher concentration of fluorine delivered to the chamber 14. This will further reduce the high cost of remote plasma chamber cleaning by reducing the total gas flow to the adsorbent bed chamber 13 of process 10. In addition, the purified fluorine system 98 can preferably eliminate the use of $NF_3$.

FIGS. 4 and 5 further show the modular aspect of the HF cylinder 102 and bed chamber 104, shown as a unit 100 being removable from the purified fluorine source system 98. FIG. 5 depicts the purified fluorine supply system used in concert with the stand-alone recycle-based cleaning support system 10 of FIG. 2.

Preferably, the bed is chilled to about −30° C. to effectively remove contaminants such as $SiF_4$ from the fluorine being produced. The module may be periodically removed when the HF in the HF source is depleted. The HF source may then be refilled, and the bed may be regenerated, such as by heating from about 150° C. to about 300° C. to remove the adsorbed HF and other contaminants from the system. The HF capacity preferably ranges from about 10 lbs to about 75 lbs.

In one preferred embodiment, the fluorine generation system as shown in FIG. 4 sized and designed in accordance with overall reactor dimensions. Fluorine production rates of 70 grams per hour are made possible with a 100 amp electrolytic cell. The product fluorine produced and leaving the fluorine generator would be purified fluorine at from about 0 psig to about 30 psig.

In one preferred embodiment, the semiconductor cleaning process taking place in the process chamber operates for about 1.5 minutes, with a three minute deposition time. During this entire 4.5 minute cycle time, the fluorine is allowed to accumulate in the fluorine surge tank. The pressure in the surge tank will be relieved until the fluorine contents are consumed and the system begins to consume fluorine being produced by the fluorine generator.

The module shown in FIGS. 4 and 5 is a safety-rated gas cabinet rated for HF and fluorine, and it is contemplated that the module will be appropriately ventilated to meet safety and building codes. The contents of the HF cylinder will be monitored by a gauge or scale, which will alert the operator to low HF levels. When the HF is depleted, the entire module may be removed and sent back to the vendor for bed regeneration and HF refilling or replacement. In this way the end-user receives a freshly regenerated bed and refilled HF cylinder to be replaced in the fluorine point-of-use system.

According to the present invention, the novel process of separating, purifying and recirculating fluorine to reduce the amount of $NF_3$ reactant required in a reaction chamber cleaning process, in a closed system, is made possible for the first time due to the use of the novel $CF_x$ of the present invention as the bed material in the adsorbent bed. The preferred $CF_x$ of the present invention is made such that "x" is about 1 and, more specifically "x" is from about 0.9 to about 1.2, and most preferably "x" is about 1.15. To perform optimally with respect to the present invention, the preferred $CF_x$ pellets are manufactured from commercially available $CF_x$ powder (Advanced Research Chemicals, Catoosa, Okla.). More specifically, one preferred adsorbent material for use in the present invention comprises a composite of 90% $CF_x$ and 10% polytetrafluoroethylene (PTFE) in the form of 3 mm×10 mm extruded pellets. Specific preferred formulations for the $CF_x$ of the present invention are shown in the examples below. The invention is further illustrated by the following examples which. Unless otherwise indicated, parts, percentages and ratios are presented on a weight ratio, or mass basis.

The fluorine-compatible recycle pump used in the process of the present invention is unlike most pumps used in the semiconductor industry. Most rough vacuum pumps are made of cast iron, which is thought to give the best thermal stability, noise attenuation, strength and materials capability. Aluminum is inferior in these respects, but is used in vacuum pump applications where low weight is important and the commensurate problems can be discounted. Typically such applications involve only pumping air or inert gases. However, for applications involving high levels of fluorine in the gas stream, aluminum has advantages, being less reactive to fluorine than cast iron. In addition, aluminum advantageously reacts slowly with fluorine to desirably form an aluminum fluoride passivation layer, which prevents or minimizes further reaction with the fluorine. This is in strong contrast to typical, known fluorine applications whereby a stainless steel diaphragm pump would be used, with a relatively high level of inherent vibration and a need to detect leakage through the diaphragm. In the present application, the relatively high flow rates preclude the use of a stainless steel diaphragm pump.

According to a preferred process of the present invention, the pump comprises aluminum impregnated with polytetrafluoroethylene (PTFE). The PTFE forms a relatively low friction surface to resist galling. In a fluorine application, the PTFE coating, which is resistant to fluorine provides a protective layer to the aluminum. This minimizes the need to slowly passivate the internal surfaces of the pump with fluorine.

In fluorine applications, the use of a single shaft pump is advantageous. A single shaft pump produces no gear-related noise. Further, the single shaft design provides a low level of well-controlled vibration, which makes it suitable for on-tool mounting. The design of the pump eliminates any direct contact rotary shaft seals or flexing diaphragms to seal the fluorine in the pump. All seals that function to contain fluorine are static and hence reliable and predictable.

In addition, for fluorine application, the use of a pump with no bearings in the vacuum system is advantageous. The absence of bearings in the vacuum system results in the separation of lubricants from the fluorine stream. This results in no adverse reaction of the pump lubricant with the fluorine, no contamination of the process chamber from the pump lubricant, no contamination of the recycled fluorine gas stream from the pump lubricant and no maintenance requirements of the fluorine-contaminated pump parts.

According to the present invention, the preferred pump apparatus is a vacuum pump having pumping speeds of from about 20 m³/h to about 100 m³/h and capable of achieving pressures of from about 0.01 mbar to about 1000 mbar. Known dry vacuum pump technologies use an inert gas delta P and close tolerances to limit gas flow to the drive casing. These designs rely on close geometric clearances to control the pressure drop across annular clearances around the shaft, and, combined with a pressure regulation device, achieve a higher pressure of inert gas than that of the drive casing and/or the final stages of the pump with a minimum flow rate of inert gas. According to a preferred embodiment of the process of the present invention, this has the advantage of preventing fluorine from entering into the pump drive casing and minimizing the dilution of the recycled fluorine gas stream.

As shown in FIG. 2, according to a preferred embodiment of the present invention, when $NF_3$ passes through the process chamber 14 the gases are converted into fluorine radicals, fluorine gas and nitrogen gas with the ratio of $N_2$ to $F_2$ being 1:3. Therefore the maximum concentration of $F_2$ is 75%. However this concentration can decrease as the gas becomes diluted with the required argon/nitrogen purge gases used for the pumping recycle process. Therefore, according to a further embodiment of the present invention, according to FIG. 5, concentrations of purified $F_2$ can operate continuously as high as 75%. In this way, the $F_2$ concentration only decreases in the recycle system if the $NF_3$ feed is used. As stated above, the use of cylinder fluorine is impractical for safety reasons (the maximum volume that can be placed in such compressed cylinders is 400 psi). Therefore, the fluorine generation system 98 of the present invention is useful as such system can supply unlimited quantities of fluorine on demand with only a reasonable, standard HF cylinder supplying the fluorine gas precursor. The process of the present invention as shown in FIGS. 4 and 5 allow the fluorine concentration to be as high as 100%, if desired, as the gas is passed through the recycle pump 26. The fluorine concentration can be altered as desired from 100% fluorine down to any desired fluorine concentration by providing the argon/nitrogen gases supplied to the recycle pump 26. Therefore, the present invention as depicted in FIGS. 4 and 5, using the purified fluorine generation system 98 creates a wide range of flow conditions that will enter the process chamber 14, including conditions that would not be possible using $NF_3$ alone. The flow rate of $F_2$ entering the system preferably ranges from about 1 L/min to about 6 L/min.

EXAMPLE 1
$CF_x$ Adsorbent Formation with Pore Formation

One preferred $CF_x$ component used to make the adsorbent bed pellets of the present invention is commercially available Carbofluor™ $CF_x$, grade 2065, (wherein x is approximately 1.15) which is manufactured as a powder by Advanced Research Chemical (ARC, Catoosa, Okla.). The PTFE component was Dyneon grade TF™ 2071, and is also manufactured as a powder. The PTFE is believed to act as a binder for the pellets. In addition, isopropanol, or FC-84, which is $C_7F_{16}$ (3M Company, Minneapolis, Minn.) was added to the mixture before extrusion, and was removed after extrusion by adding heat or vacuum. It is believed that the addition of the isopropanol aids in pore formation. Isopropanol was preferably added in amounts of 64 m/100 g combined weight of the other components. The pellets were extruded with an Amandus Kahl L 175 laboratory pellet press using an Amandus Kahl (Hamburg, Germany) 3 mm die with a 9:1 pressway ratio. Table I below shows one recommended composition for the pellets of the present invention.

TABLE 1

Composition of Adsorbent Pellets

| Component | Component Role | Quantity |
| --- | --- | --- |
| $CF_x$, ARC Carbofluor ™,Grade 2065 | active adsorbent | 90 g |
| PTFE, Dyneon TF ™ 2071 | Binder | 10 g |
| 2-propanol (0.79 g/ml) or 3 M FC-84 (1.74 g/ml) | Pore former | 64 ml |

ARC Carbofluor™ Grade 2065 is preferred, but any highly fluorinated $CF_x$ could theoretically be substituted so long as x is approximately 1.15 and the compound has a significant adsorption capacity (for example, a measured $N_2$ BET surface area of 340 $m^2$/g). Table 2 lists the desired properties found in ARC 2065.

TABLE 2

ARC Carbofluor ™ Grade 2065 Properties

| | |
| --- | --- |
| Color | White |
| Carbon Source | Carbon Black |
| Total Fluoride | 64–65% |
| X in $CF_X$ | ~1.15 |
| Free oxid. Powder (iodiometric method) | <0.2% |
| Median Particle Size | <1 μm |
| True Density | 2.5 g/ml |
| Bulk Density | 0.1 g/ml |
| Surface Area ($N_2$ BET) | 340 $m^2$/g |
| Decomposition Temp | 500° C. |
| Thermal Conductivity (at STP) | ~0.4 J/m-sec-K |
| Heat Capacity (at STP) | ~0.8 J/g-K* |

*Based on literature value, varies considerably between −200° C. and 200° C.

Dyneon TF™ 2071 PTFE is the preferred binder because of its properties as set forth in Table 3 below. It is understood that a binder possessing substantially similar properties could be substituted for the Dyneon TF™ 2071.

TABLE 3

Dyneon TF ™ 2071 PTFE

| | |
| --- | --- |
| Median Particle Size | 500 μm |
| True Density | 2.16 g/ml |
| Bulk Density | 0.51 g/ml |
| Surface Area (N2 BET) | ~0 $m^2$/g |
| Melting Point Temp. | ~330° C. |
| Thermal Conductivity (at STP) | ~0.35 J/m-sec-K |
| Heat Capacity (at STP) | ~1.4 J/g-K |

EXAMPLE 2
$CF_x$ Adsorbent Pellet Formation Without Pores

Another preferred adsorbent bed pellet was made using the $CF_x$ and PTFE components set forth in Example 1. However, this other preferred adsorbent formed into pellets using the equipment and protocol as set forth in Example 1, did not incorporate the isopropanol and did not require pore formation. The $CF_x$ used to make the adsorbent bed pellets of the present invention was commercially available Carbofluor™ $CF_x$, grade 2065, (wherein x is approximately 1.15) which is manufactured as a powder by Advanced Research Chemical (ARC, Catoosa, Okla.). The PTFE component was Dyneon grade TF™ 2071, and is also manufactured as a powder. The PTFE is believed to act as a binder for the pellets. The pellets were extruded with an Amandus Kahl L 175 laboratory pellet press using an Amandus Kahl 3 mm die with a 9:1 ($CF_x$:PTFE) pressway ratio. Table I above shows one recommended composition for the pellets of the present invention. Dyneon TF™ 2071 PTFE is the preferred binder because of its properties as set forth in Table 3 above. It is understood that a binder possessing substantially similar properties could be substituted for the Dyneon TF™ 2071.

Impurity breakthrough tests with pellets manufactured without a pore-forming agent showed low effective impurity capacity and slow impurity uptake. Impurity breakthrough tests with pellets manufactured with a pore-forming agent (Example 1) by adding isopropanol or $(NH_4)_2CO_3$ to the mix before pellet extrusion (with removal by heating) improved the effective impurity capacity and rate of impurity uptake, as shown in Table 4.

TABLE 4

Effects of Using Pore Former During $CF_x$/PTFE Extrusion

| $CE_x$ Composition | 90% ARC2065 | 90% ARC2065 | 90% ARC2065 | 90% ARC2065 |
|---|---|---|---|---|
| PTFE Composition | 10% DTF2071 | 10% DTF2071 | 10% DTF 2071 | 10% DTF2065 |
| Pore Former | None (0%) | 2% (NH4)CO3 | 50% IPA | 50% IPA |
| Test Temp C | −130 | −130 | −130 | −130 |
| Test Pressure kPa | 584 | 515 | 515 | 612 |
| Test Superficial Vel. cm/s | 0.79 | 0.27 | 0.27 | 0.91 |
| Observed $CF_4$ capacity $g(CF_4)/g(bed)/kPaCF_4$ | 0.025 | 0.075 | 0.073 | 0.065 |
| Observed CF4 Equalization Time, sec | 74 | 26 | 5.7 | 7.7 |

Based on these results isopropanol (IPA), or 2-propanol is the most preferred pore-forming agent. In addition, the use of other organic compounds, including perfluorocarbon-containing compounds are contemplated, such as, for example FC-84 (predominantly $C_7F_{16}$), FC-72 (predominantly $C_6F_{14}$), FC-77 (predominantly $C_8F_{18}$), FC3283 (predominantly $C_9F_{20}$), and mixtures thereof. The aforementioned FC compounds are available from the 3M Company, (Minneapolis, Minn.).

According to the present invention, and as shown in the examples, pellet manufacturing to be used in the adsorbent bed of the present invention comprises the following steps: mixing/blending; extrusion; pore forming and drying; smoothing; passivation; and testing. First, the $CF_x$, PTFE and pore-forming components are mixed in the desired proportions and blended into a substantially homogenous mixture. This mixture is then preferably extruded through a shaping die to form pellets. The pellets are then dried at 120° C. with an atmospheric flow of dry $N_2$ for several hours. The pore former is thus removed from the mixture's matrix, leaving the desired pores. The pellets are then preferably tumbled in a vessel to remove rough edges. The pellets may be rinsed and further dried with a solvent such as FC-84 (3M, Minneapolis, Minn.) to remove dust and residues. Finally, the pellets are passivated to 150° C. in a stream of fluorine under atmospheric pressure.

As stated above, known cyclical adsorption processes typically can be carried out using two or more adsorption beds, so that one bed is undergoing adsorption while another bed undergoes regeneration. According to one preferred embodiment of the present invention, only one adsorption bed is required. This is accomplished by alternating the chamber cleaning step (during which active adsorption occurs) with one or more deposition steps (where adsorptive bed desorption and bed regeneration occurs). In this way, the bed is regenerated during a cycle when the deposition chamber is not being cleaned. Put another way, the process chamber cleaning phases and adsorption bed regeneration cycles are performed out of phase. This preferred single bed arrangement is more economical from a cost, time and space standpoint than a traditional double bed arrangement.

During the process chamber-cleaning step, the adsorbent bed is in an active adsorption phase. Exhaust flows from the reaction chamber were directed through the recycle pump into the adsorbent bed and may comprise varying amounts of $F_2$, $NF_3$, $N_2$, Ar, $SiF_4$ and HF. When the operating pressure of the adsorbent bed is reached, the exhaust flows from the adsorbent bed chamber are directed back to the process chamber minus those impurities, which have adsorbed (i.e. $SiF_4$, HF) on the $CF_x$ adsorbent. The remaining active gases are available to participate in further chamber cleaning reactions in the process chamber. This recycling process continues for the duration of the process chamber-cleaning step. A significantly reduced amount of fresh $NF_3$ cleaning gas is thus required to clean the process the process chamber clean.

At the conclusion of the chamber-cleaning step and during the deposition step, the adsorbent bed is regenerated. That is to say, those components that adsorbed during the process chamber cleaning step are desorbed by directing a flow of inert purge gas in a direction "reverse" to that of the exhaust flows during the chamber-cleaning step through the recycle pump to waste. The flow rate of the inert purge gas is selected to generate a viscous flow regime in the adsorbent bed. Preferably, prior to the end of the deposition step, the flow of inert purge gas is discontinued and the adsorbed bed is evacuated.

Table 5 shows typical operating conditions (pressure, temperature, duration) for the chamber-cleaning step (adsorb mode) and the deposition step (desorb mode).

TABLE 5

Typical Operating Conditions for Adsorb and Desorb Modes

| Mode of Operation | Operating Pressure (torr) | Operating Temp. ° C. | Duration, (s) |
|---|---|---|---|
| Adsorb | 500 to 1200 | −40 to −10 | 50 to 300 |
| Desorb | 0 to 50 | −40 to −10 | 50 to 900 |

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A method for recycling fluorine from a waste stream comprising the steps of:
   providing a process chamber having an inner surface, said surface having contaminants adhered thereto;
   providing a stream of fluorine-containing gas from a flowing gas source into the process chamber;
   contacting the contaminants with the fluorine-containing gas and removing the contaminants from the process chamber inner surface to create a waste stream;
   directing the waste stream from the process chamber to a purification chamber, said purification chamber comprising an adsorption bed containing an adsorbent;
   adsorbing contaminants in the waste stream on the adsorbent in the purification chamber;
   converting the waste stream into a recycled fluorine source stream; and
   directing the recycled fluorine source stream from the purification chamber to the process chamber as a supplemental fluorine source stream.

2. The method according to claim 1, wherein the adsorbent comprises graphite.

3. The method according to claim 1, wherein the contaminants comprise silicon-containing compounds.

4. The method according to claim 1, wherein the contaminants comprise $SiF_4$.

5. The method according to claim 1, wherein the fluorine-containing source gas is a gas mixture in which one of the components is selected from the group consisting of $NF_3$, $CF_4$, $C_2F_6$, $SF_6$, and mixtures thereof.

6. The method according to claim 1, wherein the fluorine-containing source gas is evacuated from the process chamber under negative pressure.

7. The method according to claim 6 wherein the negative pressure is achieved from at least one vacuum pump having pumping speeds of from about 20 m$^3$/h to about 100 m$^3$/h and capable of achieving pressures of from about 0.01 mbar to about 1000 mbar.

8. The method according to claim 1, wherein the adsorbent bed in the purification chamber is maintained at a temperature of from about −150° C. to about 20° C.

9. The method according to claim 1, wherein the pressure in the purification chamber is maintained at a pressure of from about 300 torr to about 2000 torr.

10. The method according to claim 1, further comprising the steps of:
    regenerating the adsorption bed by directing a flow of adsorption bed regenerating gas from a regenerating gas source into the absorption bed;
    cleansing the adsorption bed of contaminants and directing the contaminants into the regenerating gas; and
    directing the contaminant-containing regenerating gas from the purification chamber.

11. The method according to claim 10, wherein the contaminant is a silicon-containing compound.

12. The method according to claim 11, wherein the silicon-containing compound includes $SiF_4$.

13. The method according to claim 10, wherein the adsorption bed regenerating gas includes nitrogen.

14. The method according to claim 10, wherein the adsorbent further comprises an organic compound selected from the group consisting of propanols, heptanes and perfluoro-containing compounds.

15. The method according to claim 14, wherein the propanol comprises 2-propanol.

16. The method according to claim 14, wherein the heptane comprises hexadecafluoroheptane.

17. A method for recycling fluorine from a waste stream comprising the steps of:
    providing a process chamber having an inner surface, said surface having contaminants adhered thereto;
    providing a stream of purified fluorine gas from a fluorine gas source into the process chamber, wherein said fluorine gas source is provided from a fluorine precursor source located proximate to an adsorbent bed in a replaceable unit;
    providing an electrolytic cell comprising an electrode, said cell charged with an amount of electrolyte;
    providing a power supply and directing current from said power supply to the electrolytic cell;
    directing the fluorine precursor to the electrolytic cell;
    collecting an amount of impure fluorine from the electrolyte of the electrolytic cell to the adsorbent bed;
    adsorbing impurities from the impure fluorine on adsorbent in the adsorbent bed and producing purified fluorine;
    directing purified fluorine from the adsorbent bed;
    contacting the contaminants with the purified fluorine and removing the contaminants from the chamber inner surface to create a waste stream;
    directing the waste stream from the process chamber to a purification chamber, said purification chamber comprising an adsorption bed containing an adsorbent;
    adsorbing contaminants in the waste stream on the adsorbent in the purification chamber;
    converting the waste stream into a recycled fluorine source stream; and
    directing the recycled fluorine source stream from the cleaning chamber to the process chamber as a supplemental fluorine source stream.

18. The method according to claim 17, wherein the adsorbent comprises graphite.

* * * * *

UNITED STATES PATENT AND TRADEMARK OFFICE
CERTIFICATE OF CORRECTION

PATENT NO. : 6,955,707 B2 Page 1 of 1
DATED : October 18, 2005
INVENTOR(S) : Edward F. Ezell et al.

It is certified that error appears in the above-identified patent and that said Letters Patent is hereby corrected as shown below:

<u>Column 4,</u>
Line 20, replace "about 40º" with -- about -40º --.

Signed and Sealed this

Tenth Day of January, 2006

JON W. DUDAS
*Director of the United States Patent and Trademark Office*